(12) United States Patent
Yao et al.

(10) Patent No.: US 9,082,891 B2
(45) Date of Patent: Jul. 14, 2015

(54) METHODS FOR MANUFACTURING ISOLATED DEEP TRENCH AND HIGH-VOLTAGE LED CHIP

(71) Applicant: ENRAYTEK OPTOELECTRONICS CO., LTD., Shanghai (CN)

(72) Inventors: Lujun Yao, Shanghai (CN); Deyuan Xiao, Shanghai (CN); Richard Ru-Gin Chang, Shanghai (CN); Hongbo Yu, Shanghai (CN)

(73) Assignee: ENRAYTEK OPTOELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/383,065

(22) PCT Filed: Mar. 1, 2013

(86) PCT No.: PCT/CN2013/072079
§ 371 (c)(1),
(2) Date: Sep. 4, 2014

(87) PCT Pub. No.: WO2013/131449
PCT Pub. Date: Sep. 12, 2013

(65) Prior Publication Data
US 2015/0024524 A1 Jan. 22, 2015

(30) Foreign Application Priority Data
Mar. 5, 2012 (CN) .......................... 2012 1 0055801

(51) Int. Cl.
*H01L 21/00* (2006.01)
*H01L 21/20* (2006.01)
(Continued)

(52) U.S. Cl.
CPC .......... *H01L 33/0075* (2013.01); *H01L 27/156* (2013.01); *H01L 33/06* (2013.01);
(Continued)

(58) Field of Classification Search
None
See application file for complete search history.

(56) References Cited

U.S. PATENT DOCUMENTS 6,015,979 A * 1/2000 Sugiura et al. .................. 257/86
6,724,068 B2 4/2004 Matsuyama
(Continued)

FOREIGN PATENT DOCUMENTS

CN 102354699 A 2/2012
CN 102593284 A 7/2012
JP 2002-359437 A 12/2002

*Primary Examiner* — Mary Wilczewski
*Assistant Examiner* — Erik T Peterson
(74) *Attorney, Agent, or Firm* — Muncy, Geissler, Olds & Lowe, P.C.

(57) ABSTRACT

A method for manufacturing a deep isolation trench (221) and a method for manufacturing a high-voltage LED chip. Steps of the method for manufacturing a deep isolation trench (221) are as follows: forming a mask layer (202) on a substrate (200), and forming, in the mask layer, through etching, multiple windows (204) isolated from each other, the bottom of each window exposing the substrate; with epitaxial lateral overgrowth, forming an epitaxial structure (212) inside each window and a part of the mask layer around the window, respectively, each epitaxial structure having a trapezoidal cross section with a long bottom and a short top, and a gap between adjacent epitaxial structures forming a first deep trench (214); etching each epitaxial structure, forming a first shoulder (218) and a second shoulder (221) at both sides of each epitaxial structure, respectively, and forming a deep isolation trench above the mask layer between the adjacent epitaxial structures. The method for manufacturing a high-voltage LED chip is capable of decreasing preparation cost of the deep isolation trench in the high-voltage LED chip, and increasing continuity and compactness interconnection performance of an insulation isolation dielectric layer and an interconnection electrode layer between deep isolation trenches within a high-voltage LED chip.

10 Claims, 6 Drawing Sheets

(51) Int. Cl.
*H01L 21/36* (2006.01)
*H01L 33/00* (2010.01)
*H01L 27/15* (2006.01)
*H01L 33/44* (2010.01)
*H01L 33/06* (2010.01)
*H01L 33/42* (2010.01)
*H01L 21/02* (2006.01)
*H01L 33/62* (2010.01)
*H01L 33/20* (2010.01)

(52) U.S. Cl.
CPC ............... *H01L 33/42* (2013.01); *H01L 33/44* (2013.01); *H01L 21/0254* (2013.01); *H01L 21/02458* (2013.01); *H01L 21/02647* (2013.01); *H01L 33/007* (2013.01); *H01L 33/20* (2013.01); *H01L 33/62* (2013.01); *H01L 2924/0002* (2013.01); *H01L 2933/0016* (2013.01); *H01L 2933/0025* (2013.01); *H01L 2933/0033* (2013.01)

(56) References Cited

U.S. PATENT DOCUMENTS

| | | |
|---|---|---|
| 2002/0079500 A1 | 6/2002 | Liu et al. |
| 2004/0219702 A1* | 11/2004 | Nagai et al. ..................... 438/46 |
| 2007/0184637 A1* | 8/2007 | Haskell et al. ................ 438/481 |
| 2008/0279242 A1* | 11/2008 | Bour ........................ 372/45.011 |
| 2010/0001257 A1 | 1/2010 | Yu et al. |
| 2010/0044719 A1* | 2/2010 | Yu et al. ......................... 257/76 |
| 2011/0156064 A1 | 6/2011 | Seo et al. |
| 2013/0112939 A1* | 5/2013 | Chen et al. ..................... 257/13 |

* cited by examiner

```
┌─────────────────────────────────────────────────────────────┐
│ Provide a substrate, form a mask layer over a surface of    │
│ the substrate and etch the mask layer to form therein a     │──╲╱ S100
│ plurality of windows, wherein the plurality of windows are  │
│ spaced from one another and each of the plurality of        │
│ windows exposes the underlying substrate                    │
└─────────────────────────────────────────────────────────────┘
                              ↓
┌─────────────────────────────────────────────────────────────┐
│ Perform an ELOG process to form epitaxial structures, each  │
│ filling, and covering a portion of the mask layer           │
│ surrounding, a corresponding one of the plurality of        │
│ windows, so that a first deep trench is formed between each │──╲╱ S101
│ pair of adjacent ones of the epitaxial structures, wherein  │
│ each of the epitaxial structures has a trapezoid-shaped     │
│ cross section that is broad at the bottom and narrow at the │
│ top, and each of the epitaxial structures includes an       │
│ n-type nitride layer, a multi-quantum-well layer and a      │
│ p-type nitride layer from the bottom upward                 │
└─────────────────────────────────────────────────────────────┘
                              ↓
┌─────────────────────────────────────────────────────────────┐
│ Etch each of the epitaxial structures to form a first       │
│ shoulder on one end thereof and a second shoulder on the    │
│ other end thereof, wherein each of the first and second     │
│ steps is formed by etching through the p-type nitride       │
│ layer and the multi-quantum-well layer and stops in the     │──╲╱ S102
│ n-type nitride layer so that a plurality of micro cells are │
│ formed and a deep isolation trench is formed over the mask  │
│ layer and between each pair of adjacent ones of the         │
│ plurality of micro cells, wherein each of the plurality of  │
│ micro cells at least includes a corresponding one of the    │
│ epitaxial structures and a portion of the substrate         │
│ underlying the corresponding epitaxial structure            │
└─────────────────────────────────────────────────────────────┘
                              ↓
┌─────────────────────────────────────────────────────────────┐
│ Form a current spreading layer over a central portion of a  │──╲╱ S103
│ top surface of the epitaxial structures                     │
└─────────────────────────────────────────────────────────────┘
                              ↓
┌─────────────────────────────────────────────────────────────┐
│ Form an isolating dielectric layer, covering a surface of   │
│ each exposed portion of the mask layer, a surface of each   │
│ second shoulder and a surface of a potion between the       │
│ second shoulder to a corresponding current spreading layer, │──╲╱ S104
│ wherein the isolating dielectric layer further extends to   │
│ each current spreading layer and covers a portion of a top  │
│ surface of each current spreading layer                     │
└─────────────────────────────────────────────────────────────┘
                              ↓
┌─────────────────────────────────────────────────────────────┐
│ Form an interconnecting contact layer, covering a portion   │
│ of the isolating dielectric layer between each pair of      │
│ adjacent micro cells, a portion of the current spreading    │
│ layer on a first micro cell adjacent to a proximal end of   │
│ a corresponding portion of the isolating dielectric layer   │
│ and a portion of a bottom surface of the first shoulder of  │
│ a last micro cell, wherein the interconnecting contact      │──╲╱ S105
│ layer between each pair of adjacent micro cells has one end │
│ extending to a corresponding first shoulder and covering a  │
│ surface of a portion of the first shoulder and has the      │
│ other end extending to a corresponding current spreading    │
│ layer and covering a surface of a portion of the current    │
│ spreading layer, such that the micro cells are connected    │
│ in series                                                   │
└─────────────────────────────────────────────────────────────┘
                              ↓
┌─────────────────────────────────────────────────────────────┐
│ Form a P-side electrode on the interconnecting contact      │
│ layer over the p-type nitride layer of the first micro cell │──╲╱ S106
│ and an N-side electrode on the interconnecting contact      │
│ layer over the n-type nitride layer of the last micro cell  │
└─────────────────────────────────────────────────────────────┘
```

FIG. 2

FIG. 3a
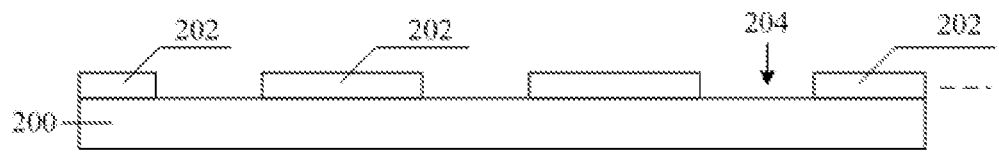
FIG. 3b
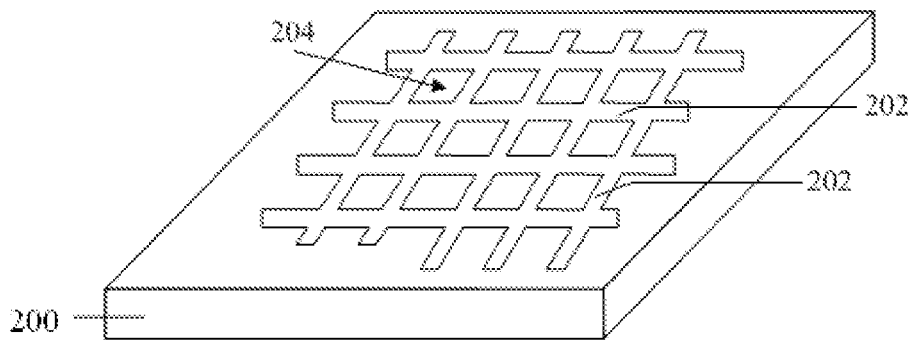
FIG. 3c

METHODS FOR MANUFACTURING ISOLATED DEEP TRENCH AND HIGH-VOLTAGE LED CHIP

TECHNICAL FIELD

The present invention relates generally to the fabrication of light-emitting devices, and in particular to a method of forming deep isolation trenches and a method of forming a high-voltage LED chip incorporating the deep isolation trenches.

BACKGROUND

With the rapid development of semiconductor integration technology and the enhancement of electron-to-photon conversion efficiency, light-emitting diodes (LEDs) fabricated from nitrides of Group III materials have been widely used. In addition, with the diversification of applications and the increase of market demand, high-power, high-brightness LED chips are gaining more and more popularity.

Most of the existing high-power (HP) LED chips are still based on conventional large-die, low-voltage, direction-current (DC) LEDs and are grouped into horizontal and vertical structures. Compared with LED chips composed of small-die LEDs, a horizontal HP LED chip composed of large-die LEDs is usually required to operate at a relatively large current. This requires the device to have a good equilibrium between its P- and N-side electrodes, because any defective equilibrium will lead to significant current crowding, which can cause droop effect with the temperature rising around the electrodes, hence impinging the reliability and shortening the service life of the chip. On the other hand, it is a great challenge to homogenize distribution of the current density over the HP LED chip to mitigate the current crowding. Further, due to the geometric nature of the chip, the longer distance light travels in the chip, the more likely the light is to be absorbed. Therefore, a horizontal HP LED chip composed of large-die LEDs typically has lower light extraction efficiency than the one composed of small-die LEDs.

A vertical HP LED chip composed of large-die LEDs is advantageous over the horizontal HP LED chip composed of large-die LEDs in a more homogeneous current density distribution due to less horizontal current paths. In addition, as the vertical HP LED chip uses a conductive substrate instead of a sapphire substrate, it has further advantages including increased thermal conductivity, prevented current crowding, improved heat dissipation, and reduced temperature in the chip, which results in improved light extraction efficiency. Notwithstanding, given the fact that the sapphire substrate is indispensable in the process of growing an epitaxial layer for the LED chip due to its excellent intrinsic capacity to facilitate the growth of LED material, in practical fabrication of the vertical device, the sapphire substrate is still used and is removed after the conductive substrate is bonded to the epitaxial layer. This complicates the manufacture, leads to a lower yield than that of the horizontal device, and raises the cost.

High-voltage (HV) LED chips, adopted as a solution for the HP LED chips, fabricated using semiconductor integration processes can achieve a higher light extraction efficiency than conventional low-voltage LED chips. A typical HV LED chip is made by dividing a large LED die into a number of micro cells, and connecting them in series. This design allows the device to be driven by a relative low current with well-distributed density. Additionally, the design shortens a light transmission path in the material of the chip to reduce the amount of loss of light due to absorption, thereby resulting in improved light extraction efficiency. Moreover, the design further allows the customization of the number and size of the micro cells to meet the requirements of different input voltages while maintaining the same reliable photoelectric properties as a HP LED chip. A HV LED chip differs in process from a massively-produced, low-voltage HP LED chip primarily in having a number of trenches formed by etching. As these trenches are intended to isolate the micro cells from one another, they are generally deep enough to reach the insulated underlying sapphire substrate. The depth of the trenches is typically 5~8 μm, varying with the geometry of the epitaxial layer.

There have been many processes proposed to fabricate such a HV LED chip, one of which is by growing an epitaxial layer on an aluminum nitride (AlN) or silicon carbide (SiC) substrate which possesses a high thermal conductivity, forming deep trenches down into a semi-insulating buffer layer or directly into the semi-insulating substrate by photolithography and etching such that a plurality of micro cells isolated from one another are formed between the trenches, forming electrodes and interconnecting them with conductive wires. While the HV LED chip made by this method has good heat dissipation performance, unreliable interconnection of the conductive wires remains a problem. Any loose or broken solder joint will lead to failure of the whole HV LED chip. Another known process to fabricate a HV LED chip is to form deep trenches with perpendicular sidewalls by inductively coupled plasma (ICP) etching and fill the trenches with an insulating polymeric material to the same level as a p-type gallium nitride (GaN) layer, or directly form deep trenches with tapered sidewalls by manipulating parameters of the ICP etching. Still another known process to fabricate a HV LED chip is to form deep trenches with tapered sidewalls by etching and deposit a considerable thickness of insulating dielectric therein to achieve isolation.

It can be concluded from the aforementioned processes that the formation of the deep trenches between the micro cells of the HV LED chip involves deposition of a hard mask and performance of an ICP etching process, which leads to great process complexity, and in particular, the multiple ICP etching processes inevitably introduce impairment to the epitaxial layer, thus adversely affecting the process cost and yield. In addition, while there is generally no specific requirement imposed on the width of the deep trenches, considering the obvious fact that too larger trench width will lead to a smaller effective emitting area and hence lower performance of the LED chip, it is desirable for these processes to have a capability of forming the deep trenches with a large ratio of depth to width. However, the trench width is hard to be reduced. Furthermore, in order to ensure sufficient continuity and compactness of insulating, isolating dielectric layers and interconnecting contact layers within the deep trenches, the sidewalls of the trenches etched by the ICP process is required to have a suitable slope, which is indeed a challenging task. Therefore, the formation of the HV LED chip in each of the above processes involves repeated deposition of a hard mask and performance of an ICP etching process, as well as other suitable process, in order to ensure sufficient insulation between the micro cells and suitable continuity and compactness of the interconnecting contact layers.

There are great difficulties in addressing these problems, and therefore needs a novel process of forming a HV LED chip, which is capable of automatic formation of deep trenches between micro cells of a HV LED chip to reduce the cost of forming the deep trenches of the HV LED chip and ensure sufficient continuity and compactness of insulating, isolating dielectric layers and interconnecting contact layers within the deep trenches.

SUMMARY OF THE INVENTION

An objective of the present invention is to provide a method of forming deep isolation trenches and a method of forming a high-voltage LED chip to reduce the cost of forming the deep trenches of the HV LED chip and ensure sufficient continuity and compactness of insulating, isolating dielectric layers and interconnecting contact layers within the deep trenches.

In order to address the above issues, the present invention provides a method of forming deep isolation trenches, including the steps of: providing a substrate, forming a mask layer over a surface of the substrate and etching the mask layer to form therein a plurality of windows, wherein the plurality of windows are spaced from one another and each of the plurality of windows exposes the underlying substrate; performing an epitaxial lateral overgrowth process to form epitaxial structures, each filling, and covering a portion of the mask layer surrounding, a corresponding one of the plurality of windows, so that a first deep trench is formed between each pair of adjacent ones of the epitaxial structures, wherein each of the epitaxial structures has a trapezoid-shaped cross section that is broad at the bottom and narrow at the top, and each of the epitaxial structures includes an n-type nitride layer, a multi-quantum-well layer and a p-type nitride layer from the bottom upward; and etching each of the epitaxial structures to form a first shoulder on one end thereof and a second shoulder on the other end thereof, wherein each of the first and second shoulders is formed by etching through the p-type nitride layer and the multi-quantum-well layer and stops in the n-type nitride layer, so that a deep isolation trench is formed over the mask layer and between each pair of adjacent ones of the epitaxial structures.

Optionally, a width, a sidewall slope and a width-to-depth ratio of the first deep trench may be determined according to a pattern width and a thickness of the mask layer and parameters of the epitaxial lateral overgrowth process.

Optionally, the mask layer may be formed by plasma-enhanced chemical vapor deposition (PECVD) from silicon oxide or silicon nitride to a thickness of 1~4 µm.

Optionally, etching each of the epitaxial structures to form the first and second shoulders may include concurrently etching a portion of the mask layer.

In order to achieve the objectives, the present invention further provides a method of forming a high-voltage (HV) LED chip, including the steps of: providing a substrate, forming a mask layer over a surface of the substrate and etching the mask layer to form therein a plurality of windows, wherein the plurality of windows are spaced from one another and each of the plurality of windows exposes the underlying substrate; performing an epitaxial lateral overgrowth process to form epitaxial structures, each filling, and covering a portion of the mask layer surrounding, a corresponding one of the plurality of windows, so that a first deep trench is formed between each pair of adjacent ones of the epitaxial structures, wherein each of the epitaxial structures has a trapezoid-shaped cross section that is broad at the bottom and narrow at the top, and each of the epitaxial structures includes an n-type nitride layer, a multi-quantum-well layer and a p-type nitride layer from the bottom upward; etching each of the epitaxial structures to form a first shoulder on one end thereof and a second shoulder on the other end thereof, wherein each of the first and second shoulders is formed by etching through the p-type nitride layer and the multi-quantum-well layer and stops in the n-type nitride layer so that a plurality of micro cells are formed and a deep isolation trench is formed over the mask layer and between each pair of adjacent ones of the plurality of micro cells, wherein each of the plurality of micro cells at least includes a corresponding one of the epitaxial structures and a portion of the substrate underlying the corresponding epitaxial structure; forming a current spreading layer over a central portion of a top surface of each of the epitaxial structures; forming an isolating dielectric layer, covering a surface of each exposed portion of the mask layer, a surface of each second shoulder and a surface of a potion between the second shoulder to a corresponding current spreading layer, wherein the isolating dielectric layer further extends to each current spreading layer and covers a portion of a top surface of each current spreading layer; forming an interconnecting contact layer, covering a portion of the isolating dielectric layer between each pair of adjacent micro cells, a portion of the current spreading layer on a first micro cell adjacent to a proximal end of a corresponding portion of the isolating dielectric layer and a portion of a bottom surface of the first shoulder of a last micro cell, wherein the interconnecting contact layer between each pair of adjacent micro cells has one end extending to a corresponding first shoulder and covering a surface of a portion of the first shoulder and has the other end extending to a corresponding current spreading layer and covering a surface of a portion of the current spreading layer, such that the micro cells are connected in series; and forming a P-side electrode on the interconnecting contact layer over the p-type nitride layer of the first micro cell and an N-side electrode on the interconnecting contact layer over the n-type nitride layer of the last micro cell.

Optionally, a width, a sidewall slope and a width-to-depth ratio of the first deep trench may be determined according to a pattern width and a thickness of the mask layer and parameters of the epitaxial lateral overgrowth process.

Optionally, a passivation layer may be further deposited over a surface of the HV LED chip.

Optionally, the mask layer may be formed by PECVD from silicon oxide or silicon nitride to a thickness of 1~4 µm.

Optionally, etching each of the epitaxial structures to form the first and second shoulders may include concurrently etching a portion of the mask layer.

Optionally, the current spreading layer may be formed of indium tin oxide (ITO).

Optionally, forming the current spreading layer over the central portion of the top surface of each of the epitaxial structures may include: evaporating and depositing an ITO layer over a top surface of the p-type nitride layer of each of the epitaxial structures; removing a portion of the ITO layer overlying a peripheral portion of the top surface of the p-type nitride layer of each of the epitaxial structures by etching; and performing an annealing process to form the transparent current spreading layer.

Optionally, the isolating dielectric layer may be formed by PECVD.

Optionally, the HV LED chip may be diced along at least one of the deep isolation trenches into dies and the dies are subsequently packaged into high-power LED chips.

Optionally, a number of the micro cells in series may be determined by a voltage of the HV LED chip.

It can be understood from the foregoing description that, compared with the conventional processes for forming deep isolation trenches between micro cells of a HV LED chip, the methods of the present invention are performed by depositing a mask layer over a sapphire substrate, forming, by photolithography and etching, a plurality of windows which are isolated from one another and each of the windows exposes the underlying substrate, and forming, by an ELOG process, the micro cells of the HV LED chip as trapezoid-shaped epitaxial structures, each filling, and covering part of the mask layer surrounding, a corresponding one of the windows, the space between each pair of adjacent ones of the epitaxial structures automatically forming the first deep trench. Since the width, sidewall slope and width-to-depth ratio of the first deep trench is adjustable by changing a pattern width or a thickness of the mask layer, or changing parameters of the ELOG process, HV LED chips with different geometric profiles of the first deep trench can be realized. The ELOG process enables the automatic formation of the deep isolation trenches and thus eliminates the need for adopting multiple ICP etching processes, and the methods can be used in the fabrication of any other LED chip which incorporates a plurality of interconnected LED cells.

BRIEF DESCRIPTION OF DRAWINGS

FIG. 2 is a flowchart illustrating a method of forming a HV LED chip according to an embodiment of the invention.

FIGS. 3a to 3j are schematic cross-sectional views showing various steps of the method of forming a HV LED chip.

DETAILED DESCRIPTION

The above and other objectives, advantages and salient features of the invention will become apparent from the following detailed description, which, taken in conjunction with the accompanying drawings, discloses preferred embodiments of the invention.

The embodiments are intended to describe aspects of the invention in sufficient detail. Other embodiments can be utilized and changes can be made by those skilled in the art without departing from the scope of the present invention. The following detailed description of the invention is, therefore, not to be taken in a limiting sense.

In addition, the accompanying drawings are schematic representations only and of which the cross-sectional views illustrative of the various steps may not be drawn to common scale, but partially enlarged for the sake of clarity in explaining the preferred embodiments. These schematic representations are exemplary configurations and they are not intended to be limiting. Further, while omitted, it is to be understood that in practical manufacturing applications, sizes in the three dimensions of space, namely, length, width and depth, should also be included in the cross-sectional views.

Figure 1:
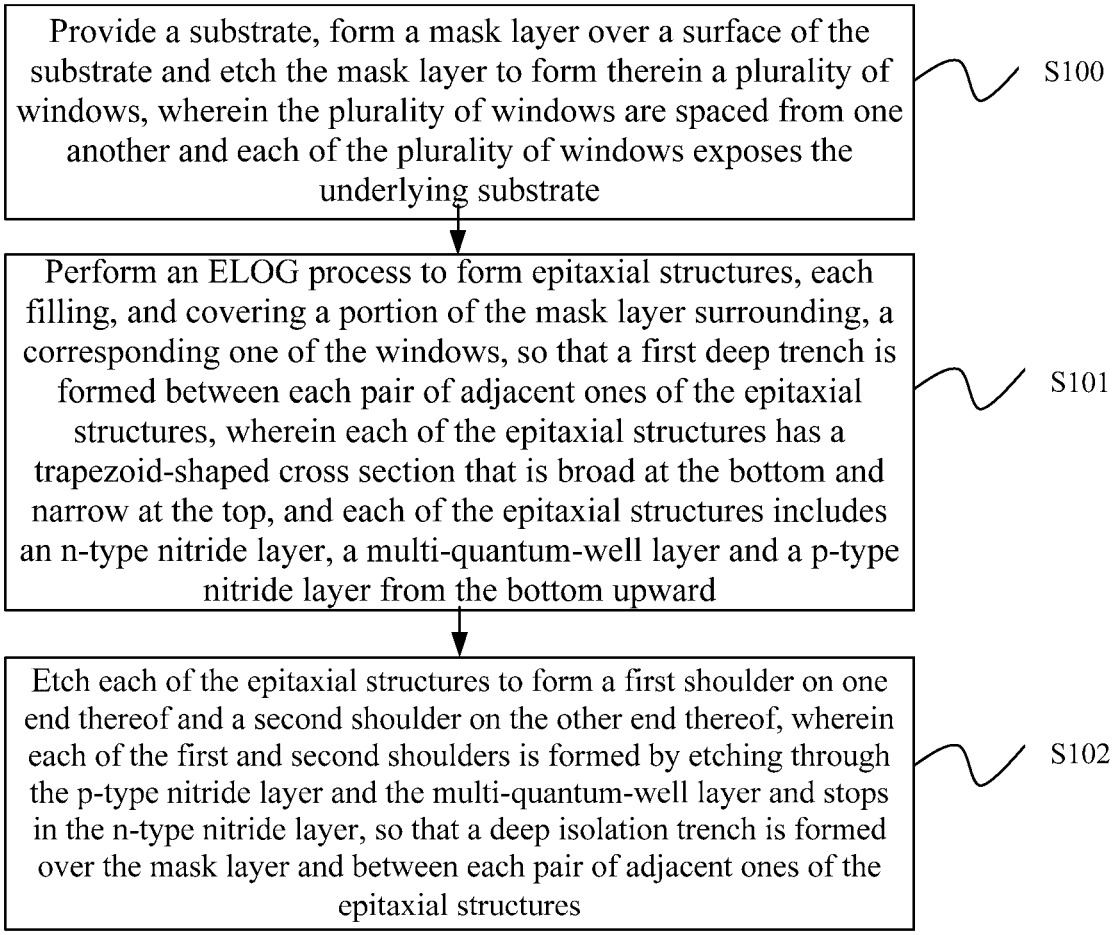
FIG. 1 depicts a flowchart graphically illustrating a method of forming deep isolation trenches in accordance with an embodiment of the present invention.

A method of forming deep isolation trenches is described in detail below with reference to FIG. 1, taken in conjunction with FIGS. 3a to 3e.

In step S100, a substrate is provided and which surface is then coated with a mask layer, and the mask layer is subsequently etched to form therein a plurality of windows which are spaced from one another and each of the windows exposes the underlying substrate.

Referring to FIG. 3a, a substrate 200 is provided and the substrate 200 may be a sapphire substrate, and the sapphire substrate may be cleaned in advance. Additionally, a mask layer 202 having a thickness of 1 µm to 4 µm may be formed on the substrate 200 by performing a plasma-enhanced chemical vapor deposition (PECVD) process. The material of the mask layer 202 may be silicon oxide or silicon nitride. Referring to FIG. 3b, the mask layer 202 is then subjected to a photolithograph and etching process to form therein a plurality of windows 204 which are spaced from one another and each of the windows 204 exposes the underlying substrate 200. The remaining parts of the mask layer 202 between the windows 204 are retained to form the desired deep isolation trenches 221 in subsequent processes. The number and locations of the windows 204 may be determined in advance according to practical requirements of a HV LED chip. In this embodiment, the windows 204 are formed as an array, which configuration can be better understood by examining FIG. 3c which is an oblique view of FIG. 3b.

In step S101, an epitaxial lateral overgrowth (ELOG) process is performed to form epitaxial structures, each filling, and covering part of the mask layer surrounding, a corresponding one of the plurality of windows, such that a first deep trench is formed between each pair of adjacent ones of the epitaxial structures. Each of the epitaxial structures has a cross section in the shape of a regular trapezoid which is broad at the bottom and narrow at the top, and each of the epitaxial structures includes an n-type nitride layer, a multi-quantum-well layer and a p-type nitride layer from the bottom upward.

Figure 3D:
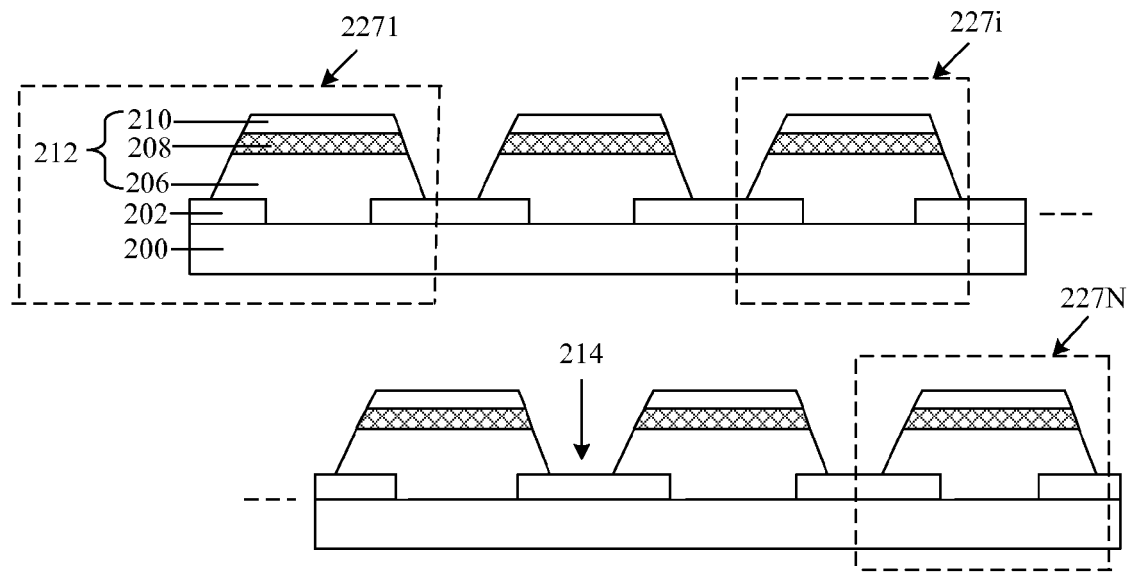

Referring to FIG. 3d, the ELOG process is performed to form epitaxial structures 212. Each epitaxial structures 212 fills a corresponding one of the plurality of windows 204 and also covers part of the mask layer 202 surrounding the corresponding window 204. Each of the epitaxial structures 212 includes an n-type nitride layer 206, a multi-quantum-well layer 208 and a p-type nitride layer 210 from the bottom upward.

Growth of each epitaxial structure 212 in the ELOG process may include first growing within a corresponding window 204 and then laterally extending to cover the part of the mask layer 202 surrounding the window 204 so that the epitaxial structure 212 assumes the trapezoid-shaped cross section that is broad at the bottom and narrow at the top, and cooperates with each adjacent epitaxial structure 212 to define therebetween a first deep trench 214. The first deep trench 214 has a cross section broad at the top and narrow at the bottom, which facilitates the step coverages of an isolating dielectric layer and an interconnecting contact layer to be deposited over the deep isolation trenches 221 in subsequent processes. Further, the first deep trenches 214 isolate the epitaxial structures 212 from one another to entail them as micro cells 227i of the HV LED chip, wherein i=1, 2, . . . , and N, where N is a natural number. First deep trenches 214 with various widths, sidewall slopes and width-to-depth ratios can be obtained by adjusting a width and a depth of the mask layer 202 and parameters of the ELOG process.

In step S102, each of the epitaxial structures is etched to form a first shoulder on its one end and a second shoulder on its other end. Each of the first and second shoulders is formed by etching through the p-type nitride and multi-quantum-well layers and stops in the n-type nitride layer on the mask layer, thus forming a deep isolation trench over the mask layer between each pair of adjacent epitaxial structures.

Figure 3E:
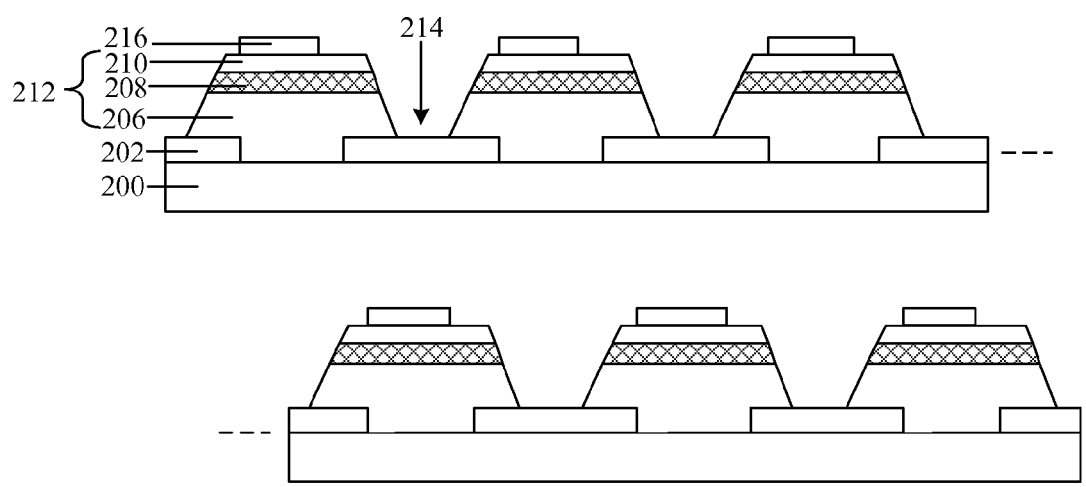
Figure 3F:
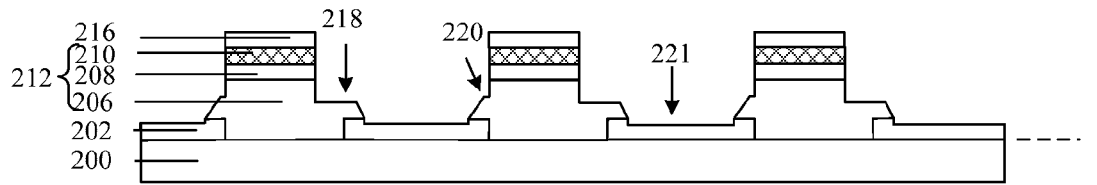

Referring to FIG. 3e, a photoresist is first coated over each of the epitaxial structures 212 and then patterned by photolithography to form a photoresist layer 216. As shown in FIG. 3f, each epitaxial structure 212 is etched by ICP etching to form the first and second shoulders 218, 220, on two ends thereof respectively, using the patterned photoresist layer 216 as a mask. With the first and second shoulders 218, 220 formed, the micro cells 227i (i=1, 2, . . . , and N, where N is a natural number) are formed, and a deep isolation trench 221 having a cross section broad at the top and narrow at the bottom is automatically formed from the former first deep trench 214 over the mask layer 202 between each pair of adjacent micro cells 227i. Each of the first and second shoulders 218, 220 extends through the p-type nitride 210 and multi-quantum-well layers 208 and stops in the n-type nitride layer 206 over the mask layer 202. Each micro cell 227i includes the corresponding etched epitaxial structure and part of the substrate underlying the etched epitaxial structure. The substrate underlying the etched epitaxial structure is desirable to assume a shape suitable for bearing a HV LED chip so that it can operate normally. Each micro cell 227i may further include the part of the mask layer under the corresponding epitaxial structure 212. Due to the highly anisotropic nature of the ICP etching, an etched surface typically well resembles the original profile. Therefore, part of each etched epitaxial structure 212 between the first and second shoulders 218, 220 can keep a trapezoid-shaped cross section. That is, each of the first and second shoulders 218, 220 has a flat top face and a sloped side face.

In addition, in a subsequent process, an N-side electrode is formed on the top face of each first shoulder 218, with no electrode needing to be formed on the top face of any second shoulder 220. Therefore, the top face of the first shoulder 218 is desirable to be broader than the top face of the second shoulder 220. However, since any increase in the width of the top face of the second shoulder 220 leads to the removal of more parts of each of the p-type nitride, multi-quantum-well and n-type nitride layers and thus causes a reduction in the light extraction efficiency, it is also desirable that the width of the top face of the second shoulder 220 is controlled in a suitable range.

Further, during the ICP etching for forming the first and second shoulders 218, 220 in the n-type nitride layer 206, a further part of the mask layer 202 may be removed concurrently.

To further achieve the objectives of the present invention, a method of forming a HV LED chip is provided, the method of forming a HV LED chip is described in detail below with reference to FIGS. 3a to 3j.

In step S200, a substrate is provided and which surface is then coated with a mask layer, and the mask layer is subsequently etched to form therein a plurality of windows which are spaced from one another and each of the windows exposes the underlying substrate.

As step S200 is the same as the above-described step S100 shown in FIGS. 3a and 3b, further detailed description of it is omitted for brevity.

In step S201, an ELOG process is performed to form epitaxial structures, each filling, and covering part of the mask layer surrounding, a corresponding one of the plurality of windows, such that a first deep trench is formed between each pair of adjacent ones of the epitaxial structures. Each of the epitaxial structures has a cross section in the shape of a regular trapezoid which is broad at the bottom and narrow at the top, and each of the epitaxial structures includes an n-type nitride layer, a multi-quantum-well layer and a p-type nitride layer from the bottom upward.

As step S201 is the same as the above-described step S101 shown in FIG. 3d, further detailed description of it is omitted for brevity.

In step S202, each of the epitaxial structures is etched to form a first shoulder on its one end and a second shoulder on its other end. Each of the first and second shoulders is formed by etching through the p-type nitride and multi-quantum-well layers and stops in the n-type nitride layer on the mask layer, thus forming a plurality of micro cells, and a deep isolation trench is formed over the mask layer between each pair of adjacent micro cells. Each of the plurality of micro cells at least includes an epitaxial structure and a portion of the substrate underlying the epitaxial structure.

As step S202 is the same as the above-described step S102 shown in FIG. 3e, further detailed description of it is omitted for brevity.

In step S203, a current spreading layer is formed over a central portion of the top surface of each epitaxial structure.

Figure 3G:
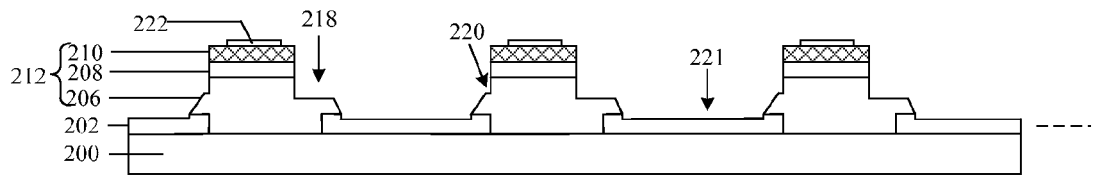

Referring to FIG. 3g, after removing the patterned photoresist layer, a layer of indium tin oxide (ITO) is first evaporated and deposited over the exposed epitaxial structure 212 and a photoresist (not shown) is then coated over the ITO layer; the photoresist is patterned by photolithography to form patterned photoresist; next, part of the ITO layer overlying a peripheral portion of the epitaxial structure 212 is removed by chemical erosion using the patterned photoresist as a mask; and afterwards, the patterned ITO layer is annealed to increase its light transmissivity. The annealed ITO layer serves as the current spreading layer 222, which is transparent and capable of dispersing a current flowing therein to alleviate the current crowding effect. Moreover, the current spreading layer 222 is also helpful in heat dissipation at surface of the HV LED chip to be formed in a subsequent process.

In step S204, an isolating dielectric layer is formed, covering the surface of each exposed part of the mask layer, the surface of each second shoulder and the surface of a portion from the second shoulder to a corresponding current spreading layer; the isolating dielectric layer further extends to each current spreading layer and covers a portion of the top surface of each current spreading layer.

Figure 3H:
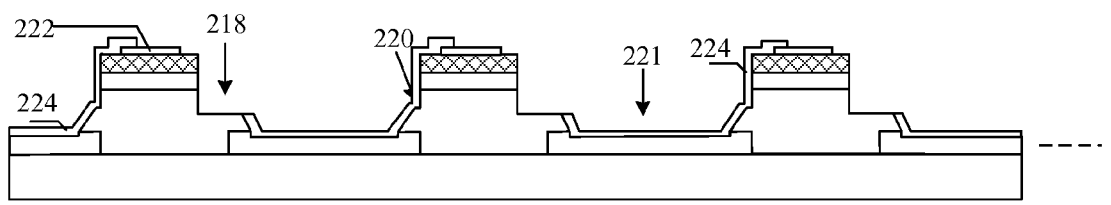

Referring to FIG. 3h, a dielectric layer is deposited over the structure resulting from Step 203 by plasma-enhanced chemical vapor deposition (PECVD), and then a photoresist (not shown) is coated over the dielectric layer; afterwards, the photoresist is patterned by photolithography to form patterned photoresist, and the exposed part of the dielectric layer is removed by chemical erosion using the patterned photoresist as a mask to form an isolating dielectric layer 224 which covers the sloped side face of the trapezoid-shaped cross section, having an original profile, of each first shoulder 218, the surface of each exposed part of the mask layer 202, the surface of each second shoulder 220 and the surface of a portion between each second shoulder 220 and its corresponding current spreading layer 222. The isolating dielectric layer 224 further extends to each current spreading layer 222 and covers a portion of the top surface of each current spreading layer 222. The isolating dielectric layer 224 may be formed of silicon oxide.

The isolating dielectric layer 224 is capable of insulating and isolating the micro cells 217i from one another of the HV LED chip to be formed in a subsequent process.

In step S205, an interconnecting contact layer is formed, covering the part of the isolating dielectric layer between each pair of adjacent ones of the micro cells, a part of the current spreading layer on the first micro cell adjacent to a proximal end of the corresponding part of the isolating dielectric layer overlying the current spreading layer, and a part of the top face of the first shoulder of the last micro cell. The interconnecting contact layer between each pair of adjacent ones of the micro cells has one end extending to the first shoulder and covering a portion of the top face of the first shoulder and has the other end extending to the current spreading layer and covering the surface of a portion of the current spreading layer, such that the micro cells are connected in series.

Figure 3I:
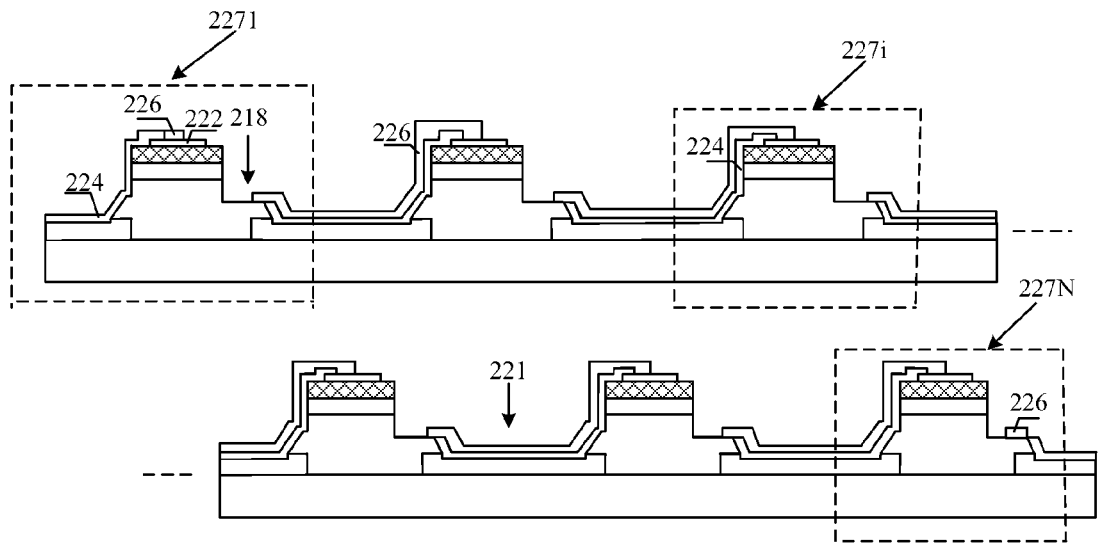

Referring to FIG. 3i, after forming a patterned photoresist over the structure resulting from Step 204, a metal layer is first evaporated and deposited; then the patterned photoresist is removed by a lift-off process, followed by an annealing process to form an interconnecting contact layer 226 covering the part of the isolating dielectric layer 224 between each pair of adjacent ones of the micro cells, a part of the current spreading layer 222 on the first micro cell adjacent to a proximal end of the corresponding part of the isolating dielectric layer, and a part of the top face of the first shoulder 218 of the last micro cell. The interconnecting contact layer 226 between each pair of adjacent ones of the micro cells has one end extending to the first shoulder 218 and covering the surface of a portion of the first shoulder 218 and has the other end extending to the current spreading layer 222 and covering the surface of a portion of the current spreading layer 222, such that the micro cell 227i are connected in series.

In step S206, a P-side electrode is formed on the interconnecting contact layer over the p-type nitride layer of the first micro cell, and an N-side electrode is formed on the interconnecting contact layer over the n-type nitride layer of the last micro cell, and the desired HV LED chip is formed.

Figure 3J:
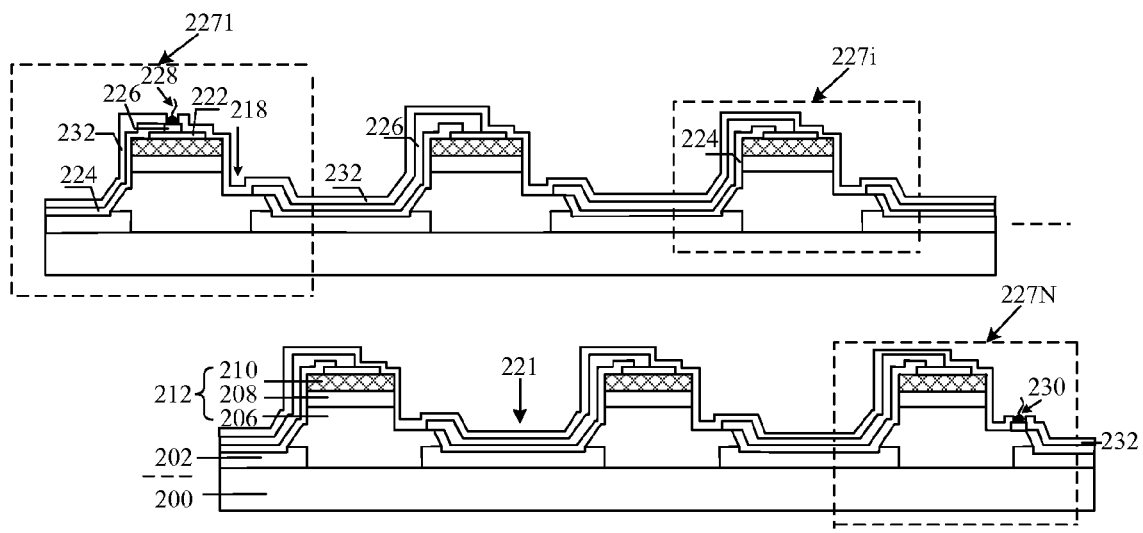

Referring to FIG. 3j, a P-side electrode 228 is formed on the part of the interconnecting contact layer 226 on the part of the p-type nitride layer 210 of the first micro cell 2271 (i=1), and simultaneously an N-side electrode 230 is formed on the part of the interconnecting contact layer 226 on the n-type nitride layer 206 of the last micro cell 227N (i=N), and the desired HV LED chip is formed. As such, the accomplished HV LED chip includes the plurality of micro cells 227i that are connected in series and are isolated from one another by automatically formed deep isolation trenches 221. Different numbers of micro cells 227i can be connected in series to meet requirements for various input voltages of a HV LED chip. For example, assuming each of such micro cells has a forward voltage of about 3.3 V, a HV LED chip can include 100 micro cells for an input voltage of 330 V, 150 micro cells for 445 V, and so forth. Further detailed description of it is omitted for brevity.

Materials from which the interconnecting contact layer 226, the P-side electrode 228 and the N-side electrode 230 can be fabricated include an alloy of chromium and gold (Cr/Au), an alloy of chromium, platinum and gold (Cr/Pt/Au), an alloy of nickel and gold (Ni/Au) and other metallic materials.

As the deep isolation trenches 221, which are formed on the basis of the corresponding first deep trenches 214, have cross sections broad at the top and narrow at the bottom, the processes for depositing the isolating dielectric layer 224 and the interconnecting contact layer 226 have increased step coverages, which result in an improvement in the continuity and compactness of parts of each of the isolating dielectric layer 224 and the interconnecting contact layer 226 within the deep isolation trenches 221 and hence an enhancement of the interconnection property of the HV LED chip.

Further, a passivation layer 232 may be further deposited over the HV LED chip to prevent any damage of the interconnecting contact layer 226.

Furthermore, the HV LED chip can be diced by laser along at least one of the deep isolation trenches 221 into dies which are subsequently packaged to produce HP LED chips.

It can be understood from the foregoing description that, compared with the conventional processes for forming deep isolation trenches between micro cells of a HV LED chip, the methods of the present invention are performed by depositing a mask layer over a sapphire substrate, forming, by photolithography and etching, a plurality of windows which are isolated from one another and each of the windows exposes the underlying substrate, and forming, by an ELOG process, the micro cells of the HV LED chip as trapezoid-shaped epitaxial structures, each filling, and covering part of the mask layer surrounding, a corresponding one of the windows, the space between each pair of adjacent ones of the epitaxial structures automatically forming the first deep trench. Since the width, sidewall slope and width-to-depth ratio of the first deep trench is adjustable by changing a pattern width or a thickness of the mask layer, or changing parameters of the ELOG process, HV LED chips with different geometric profiles of the first deep trench can be realized. The ELOG process enables the automatic formation of the deep isolation trenches and thus eliminates the need for adopting multiple ICP etching processes, and the methods can be used in the fabrication of any other LED chip which incorporates a plurality of interconnected LED cells.

While the invention has been described in terms of specific embodiments, those skilled in the art will recognize that the invention can be practiced with modifications or changes without departing from the scope of the present invention. It is, therefore, to be understood that the appended claims are intended to cover all such modifications and changes as fall within the true scope of the invention.

What is claimed is:

1. A method of forming a high-voltage (HV) light-emitting diode (LED) chip, comprising the steps of:
   providing a substrate, forming a mask layer over a surface of the substrate and etching the mask layer to form therein a plurality of windows, wherein the plurality of windows are spaced from one another and each of the plurality of windows exposes the underlying substrate;
   performing an epitaxial lateral overgrowth process to form epitaxial structures, each filling, and covering a portion of the mask layer surrounding, a corresponding one of the plurality of windows, so that a first deep trench is formed between each pair of adjacent ones of the epitaxial structures, wherein each of the epitaxial structures has a trapezoid-shaped cross section that is broad at the bottom and narrow at the top, and each of the epitaxial structures includes an n-type nitride layer, a multi-quantum-well layer and a p-type nitride layer from the bottom upward;
   etching each of the epitaxial structures to form a first shoulder on one end thereof and a second shoulder on the other end thereof, wherein each of the first and second shoulders is formed by etching through the p-type nitride layer and the multi-quantum-well layer and stops in the n-type nitride layer so that a plurality of micro cells are formed and a deep isolation trench is formed over the mask layer and between each pair of adjacent ones of the plurality of micro cells, wherein each of the plurality of micro cells at least includes a corresponding one of the epitaxial structures and a portion of the substrate underlying the corresponding epitaxial structure;
   forming a current spreading layer over a central portion of a top surface of each of the epitaxial structures;
   forming an isolating dielectric layer, covering a surface of each exposed portion of the mask layer, a surface of each second shoulder and a surface of a portion between the second shoulder and a corresponding current spreading layer, wherein the isolating dielectric layer further extends to each current spreading layer and covers a portion of a top surface of each current spreading layer;
   forming an interconnecting contact layer, covering a portion of the isolating dielectric layer between each pair of adjacent micro cells, a portion of the current spreading layer on a first micro cell adjacent to a proximal end of a corresponding portion of the isolating dielectric layer and a portion of a bottom surface of the first shoulder of a last micro cell, wherein the interconnecting contact layer between each pair of adjacent micro cells has one end extending to a corresponding first shoulder and covering a surface of a portion of the first shoulder and has the other end extending to a corresponding current spreading layer and covering a surface of a portion of the current spreading layer, such that the micro cells are connected in series; and forming a P-side electrode on the interconnecting contact layer over the p-type nitride layer of the first micro cell and an N-side electrode on the interconnecting contact layer over the n-type nitride layer of the last micro cell.

2. The method of claim 1, wherein a width, a sidewall slope and a width-to-depth ratio of the first deep trench are determined according to a pattern width and a thickness of the mask layer and parameters of the epitaxial lateral overgrowth process.

3. The method of claim 1, wherein a passivation layer is further deposited over a surface of the HV LED chip.

4. The method of claim 1, wherein the mask layer is formed by PECVD from silicon oxide or silicon nitride to a thickness of 1~4 μm.

5. The method of claim 1, wherein etching each of the epitaxial structures to form the first and second shoulders includes concurrently etching a portion of the mask layer.

6. The method of claim 1, wherein the current spreading layer is formed of indium tin oxide (ITO).

7. The method of claim 6, wherein forming the current spreading layer over the central portion of the top surface of each of the epitaxial structures includes:

evaporating and depositing an ITO layer over a top surface of the p-type nitride layer of each of the epitaxial structures;

removing a portion of the ITO layer overlying a peripheral portion of the top surface of the p-type nitride layer of each of the epitaxial structures by etching; and performing an annealing process to form the transparent current spreading layer.

8. The method of claim 1, wherein the isolating dielectric layer is formed by PECVD.

9. The method of claim 1, wherein the HV LED chip is diced along at least one of the deep isolation trenches into dies and the dies are subsequently packaged into high-power LED chips.

10. The method of claim 1, wherein a number of the micro cells in series is determined by a voltage of the HV LED chip.

* * * * *